(12) United States Patent
Hayashi (10) Patent No.: US 11,841,616 B2
(45) Date of Patent: Dec. 12, 2023

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Nozomu Hayashi, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 65 days.

(21) Appl. No.: 17/090,743

(22) Filed: Nov. 5, 2020

(65) Prior Publication Data

US 2021/0149297 A1    May 20, 2021

(30) Foreign Application Priority Data

Nov. 15, 2019 (JP) ................................. 2019-207457

(51) Int. Cl.
*G03F 7/00* (2006.01)

(52) U.S. Cl.
CPC .................................. *G03F 7/0002* (2013.01)

(58) Field of Classification Search
None
See application file for complete search history.

(56) References Cited

U.S. PATENT DOCUMENTS

| | | | | |
|---|---|---|---|---|
| 6,517,995 | B1* | 2/2003 | Jacobson | B82Y 40/00 |
| | | | | 264/2.3 |
| 2005/0212156 | A1* | 9/2005 | Tokita | B29C 43/003 |
| | | | | 264/1.36 |
| 2009/0001634 | A1* | 1/2009 | Hiroshima | G03F 7/2014 |
| | | | | 264/447 |
| 2014/0027955 | A1* | 1/2014 | Wakabayashi | G03F 7/70 |
| | | | | 264/447 |
| 2017/0023857 | A1* | 1/2017 | Sato | G03F 9/7042 |
| 2018/0029361 | A1* | 2/2018 | Jeuté | B41J 2/04595 |
| 2018/0301331 | A1* | 10/2018 | Yoshida | B29C 59/022 |
| 2020/0073233 | A1* | 3/2020 | Hatano | G03F 7/0002 |
| 2020/0192219 | A1* | 6/2020 | Hirano | G03F 7/0002 |

FOREIGN PATENT DOCUMENTS

| | | | | |
|---|---|---|---|---|
| JP | 5084823 | B2 | 11/2012 | |
| JP | 2016058735 | A | * 4/2016 | |
| WO | 2007/120537 | A2 | 10/2007 | |
| WO | WO-2019078060 | A1 | * 4/2019 | ........... B29C 33/424 |

* cited by examiner

*Primary Examiner* — Alexander M Weddle
(74) *Attorney, Agent, or Firm* — Canon U.S.A., Inc., IP Division

(57) ABSTRACT

An imprint apparatus that forms a pattern of an imprint material on a plurality of shot regions in a substrate by using a mold, the imprint apparatus comprising: a discharger configured to discharge the imprint material onto the plurality of shot regions in the substrate; a viscosity adjuster configured to adjust a viscosity of the imprint material discharged from the discharger; and a controller configured to form the pattern of the imprint material in the plurality of shot regions, by repeatedly bringing the imprint material into contact with the mold in a state where a viscosity of at least a portion of the imprint material discharged onto the plurality of shot regions is adjusted by the viscosity adjuster, and curing of the imprint material, for each of the plurality of shot regions.

5 Claims, 6 Drawing Sheets

IMPRINT APPARATUS, IMPRINT METHOD, AND METHOD OF MANUFACTURING ARTICLE

BACKGROUND OF THE INVENTION

Field of the Invention

The present disclosure relates to an imprint apparatus, an imprint method, and a method of manufacturing an article.

Description of the Related Art

As a method of manufacturing an article such as a semiconductor device or a micro-electro-mechanical systems (MEMS) device, there is known an imprint method of molding an imprint material on a substrate by using a mold. In the imprint method, the imprint material is supplied onto the substrate, and the supplied imprint material is brought into contact with the mold (imprinting). Subsequently, the imprint material is cured in a state where the imprint material and the mold are in contact with each other, and the cured imprint material is released from the mold (mold release), so that a pattern of the imprint material is formed on the substrate.

As the imprint method, there is known a method of improving productivity by supplying an imprint material beforehand to a plurality of shot regions on a substrate, and sequentially repeating imprinting, curing, and mold release for the shot regions supplied with the imprint material (Japanese Patent No. 5084823). Japanese Patent No. 5084823 discusses a method of changing the volume of the imprint material for supply depending on a volatilization time, in order to reduce the influence of the volatilization of the imprint material that volatilizes until a pattern is formed on the imprint material supplied to the plurality of shot regions. The influence on the pattern of the imprint material formed on the substrate is thus reduced, so that yields can be improved.

The imprint material is supplied onto the substrate by a discharger (a dispenser) having a plurality of discharge outlets. In the method of changing the volume of the imprint material for supply depending on the volatilization time, it may be desirable to change the amount of the imprint material to be discharged from the discharger, for each group of shot regions. However, a droplet of the imprint material to be discharged from the discharger is minute, so that it is difficult for the discharger to change the discharge amount of the imprint material for each group of shot regions.

SUMMARY OF THE INVENTION

The present disclosure is directed to an imprint apparatus capable of controlling the volatilization of an imprint material by adjusting the viscosity of the imprint material before bringing the imprint material into contact with a mold.

According to one aspect of the present disclosure, there is provided an imprint apparatus that forms a pattern of an imprint material on a plurality of shot regions in a substrate by using a mold, the imprint apparatus comprising: a discharger configured to discharge the imprint material onto the plurality of shot regions in the substrate; a viscosity adjuster configured to adjust a viscosity of the imprint material discharged from the discharger; and a controller configured to form the pattern of the imprint material in the plurality of shot regions, by repeatedly bringing the imprint material into contact with the mold in a state where a viscosity of at least a portion of the imprint material discharged onto the plurality of shot regions is adjusted by the viscosity adjuster, and curing of the imprint material, for each of the plurality of shot regions.

Further features of the present disclosure will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claims. Multiple features are described in the embodiments, but not all of the features are necessary, and multiple such features may be combined as appropriate. Furthermore, in the attached drawings, the same reference numerals are given to the same or similar configurations, and redundant description thereof is omitted.

First Exemplary Embodiment

Figure 1:
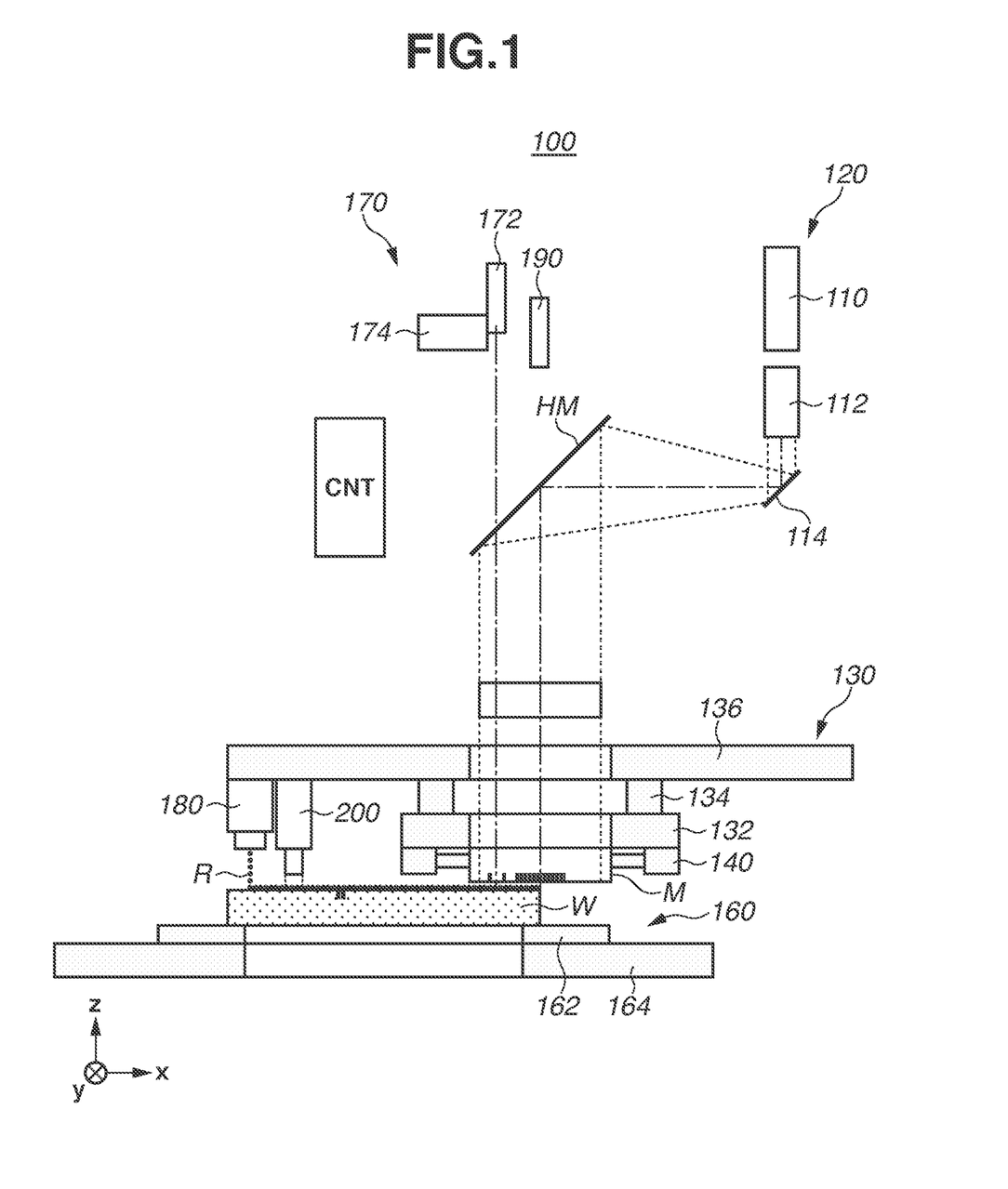
FIG. 1 is a diagram illustrating an imprint apparatus according to a first exemplary embodiment.

FIG. 1 is a schematic diagram illustrating a configuration of an imprint apparatus 100 according to a first exemplary embodiment. The configuration of the imprint apparatus 100 will be described with reference to FIG. 1. Here, each axis is determined as illustrated in FIG. 1, by defining a surface where a substrate W is disposed as an XY-plane and a direction (a height direction of the imprint apparatus 100) orthogonal thereto as a Z-direction. The imprint apparatus 100 brings an imprint material R supplied onto the substrate W into contact with a mold M, and applies energy for curing to the imprint material R, thereby forming a pattern of a curing product to which a concavo-convex pattern of the mold M is transferred. The imprint apparatus 100 in FIG. 1 is used to manufacture a device such as a semiconductor device as an article. Here, the imprint apparatus 100 will be described to which a photo-curing method of curing an imprint material by irradiation with ultraviolet light (UV light) is applied. In the present exemplary embodiment, the irradiation with the UV light as the energy for curing is performed, but the wavelength of the light can be appropriately determined depending on the imprint material R to be supplied onto the substrate W.

The imprint apparatus 100 can include a curing unit 120, a mold holding unit 130, a mold shape correcting unit 140, a substrate holding unit 160, an alignment mechanism 170, an observation unit 190, and a controller CNT. The imprint apparatus 100 further includes a supply unit 180 (a discharger (a dispenser)) for supplying the imprint material R onto the substrate W. Although not illustrated, the imprint apparatus 100 further includes a bridge surface plate for holding the mold holding unit 130, a base surface plate for holding the substrate holding unit 160, and a vibration isolator (a damper). The base surface plate supports the entire imprint apparatus 100 and forms a reference plane when a substrate stage 164 moves. The vibration isolator isolates vibration coming from a floor and supports the base surface plate.

A curable composition (can be referred to as a resist, or a resin in an uncured state) to be cured by the application of the energy for curing is used for the imprint material R. As the energy for curing, an electromagnetic wave, heat, or the like is used. As the electromagnetic wave, for example, light of a wavelength selected in a range from 10 nm or more and 1 mm or less, such as an infrared ray, a visible ray, or an ultraviolet ray, is used.

The curable composition is a composition to be cured by light irradiation or heating. The photocurable composition to be cured by the light irradiation contains at least a polymerizable compound and a photopolymerization initiator, and may contain a non-polymerizable compound or a solvent as appropriate. The non-polymerizable compound is at least one selected from a group including a sensitizer, a hydrogen donor, an internal mold release agent, a surfactant, an antioxidant, and a polymer component.

The imprint material R may be applied onto the substrate W by a spin coater or a slit coater to be in the form of a film. Further, the imprint material R may be applied onto the substrate W by a liquid jet head to be in the form of a droplet or in the form of an island or film formed of connected droplets. The viscosity (a viscosity at 25 degrees Celsius) of the imprint material R is, for example, 1 mPa·s or more and 100 mPa·s or less.

Materials such as glass, ceramic, metal, semiconductor, and resin are used for the substrate W, and a member made of a material different from that of the substrate W may be formed on a surface thereof as appropriate. Specifically, the substrate W includes a silicon wafer, a compound semiconductor wafer, and quartz glass. The substrate W can be conveyed by a substrate conveyance mechanism (not illustrated). The substrate conveyance mechanism includes a conveyance robot having a chuck such as a vacuum chuck.

The mold M is a mold for molding the imprint material R on the substrate W. The mold can also be called a template or an original plate. The mold M has a rectangular external form, and has a pattern surface (a pattern region) where a pattern (a concavo-convex pattern) to be transferred to the imprint material R on the substrate W is formed. The mold M is made of a material, e.g., quartz, for enabling the UV light for curing the imprint material R on the substrate W to pass therethrough. Further, a mold-side mark that functions as an alignment mark is formed on the pattern surface of the mold M. The mold M can be conveyed by a mold conveyance mechanism (not illustrated). The mold conveyance mechanism includes a conveyance robot having a chuck such as a vacuum chuck.

The curing unit 120 is a mechanism that cures the imprint material R by applying the energy for curing to the imprint material R via the mold M. The curing unit 120 of the present exemplary embodiment cures the imprint material R by irradiating the imprint material R with the UV light as the energy for curing. Therefore, the imprint material R of the present exemplary embodiment is a photo-curing resin to be cured by the UV light.

The curing unit 120 includes a light source unit 110 and an optical system 112. The light source unit 110 can include a light source such as a halogen lamp that generates UV light (e.g., i-line, g-line), and an oval mirror that condenses the light generated by the light source. The optical system 112 can include a lens for irradiating the imprint material R on the substrate W with the UV light, and a half mirror HM. The curing unit 120 can further include an irradiation region adjusting unit 114. The irradiation region adjusting unit 114 is used for view angle control and circumference shielding control of an irradiation region, and a digital mirror device (DMD), an aperture, an adjustable field stop, and the like can be used therefor. The irradiation region adjusting unit 114 in FIG. 1 is illustrated as a unit that reflects the light from the light source unit 110, but may be a unit that enables the light to pass therethrough.

The curing unit 120 can selectively illuminate a target shot region or part of a shot region based on the view angle control by the irradiation region adjusting unit 114. The irradiation region adjusting unit 114 can limit the irradiation with the UV light exceeding the external form of the substrate W based on the circumference shielding control for the substrate W. The optical system 112 may include an optical integrator to illuminate the mold M uniformly. The light whose range is defined by the irradiation region adjusting unit 114 is incident on the imprint material R on the substrate W via an imaging optical system (not illustrated) and the mold M.

The mold holding unit 130 can include a mold chuck 132 that holds the mold M, a mold driving mechanism 134 that drives the mold M by driving the mold chuck 132, and a base 136 that supports the mold driving mechanism 134. The mold driving mechanism 134 includes a positioning mechanism that controls the position of the mold M with respect to six axes, and a mechanism that brings the mold M into contact with the imprint material R on the substrate W (imprinting) and releases the mold M from the cured imprint material R. Here, the six axes are an X-axis a Y-axis, a Z-axis, and the rotation about each of these axes, in an XYZ coordinate system in which a support surface (a surface that supports the substrate W) of the mold chuck 132 is an XY-plane and a direction orthogonal to the XY-plane is the Z-axis.

The mold shape correcting unit 140 can be mounted on the mold holding unit 130. The mold shape correcting unit 140 can correct the shape of the mold M by pressing the mold M from the outer periphery direction by using, for example, a cylinder (an actuator) that operates with a fluid such as air or oil. Alternatively, the mold shape correcting unit 140 includes a temperature controller for controlling the temperature of the mold M, and corrects the shape of the mold M by controlling the temperature of the mold M. The substrate W can deform (typically, expand or shrink) by undergoing a process such as heat treatment. The mold shape correcting unit 140 corrects the shape of the mold M in response to such deformation of the substrate W so that an overlay error falls within tolerance.

The substrate holding unit 160 can include a substrate chuck 162 that holds the substrate W, the substrate stage 164 that drives the substrate W by driving the substrate chuck 162, and a stage drive mechanism (not illustrated). The stage drive mechanism can include a positioning mechanism that controls the position of the substrate W by controlling the position of the substrate stage 164 with respect to the above-describe six axes.

The alignment mechanism 170 can include an alignment scope 172 and a scope driving mechanism 174. The alignment scope 172 can include an automatic adjustment scope (AAS) that aligns the pattern region of the mold M and the shot region of the substrate W. The scope driving mechanism 174 drives the alignment scope 172 to a position that enables detection of the alignment mark formed on the mold M. The alignment scope 172 detects the alignment mark formed on the mold M and an alignment mark formed on the substrate W.

The supply unit 180 (the discharger) can include a tank that contains the imprint material R, a nozzle (a discharge outlet) that discharges (dispenses) the imprint material R supplied from the tank to the substrate W through a supply path, a valve on the supply path, and a supply amount controller. The supply unit 180 is also called an applier or a dispenser. The imprint material R is supplied by relatively moving the substrate W, while discharging a droplet of the imprint material from the discharge outlet of the supply unit 180. The imprint material R may be supplied to the shot region of the substrate W by moving the supply unit 180 instead of moving the substrate W. The supply unit 180 of the present exemplary embodiment consecutively supplies the imprint material R to a plurality of shot regions on the substrate W.

The observation unit 190 includes an imaging unit that can observe all the shot regions of the substrate W via the mold M. The result of the observation by the observation unit 190 is used for confirmation of the status of imprinting or mold release accompanying an imprint process, and for confirmation of the progress of filling of the mold M with the imprint material R.

A viscosity adjustment unit 200 is a mechanism that adjusts the viscosity of the imprint material R supplied (discharged) from the supply unit 180 before the imprint material R is brought into contact with the mold M. The viscosity adjustment unit 200 of the present exemplary embodiment includes a UV light irradiation mechanism and adjusts the viscosity of the imprint material R by irradiating the imprint material R supplied from the supply unit 180 onto the substrate W with weak UV light. As illustrated in FIG. 1, the viscosity adjustment unit 200 is near the supply unit 180 and can irradiate the imprint material R on the substrate W with the UV light without the intervention of the mold M. Further, the viscosity adjustment unit 200 has a function of changing the intensity of the UV light so that the viscosities of the imprint material R vary among the plurality of shot regions.

The controller CNT controls the operation of the imprint apparatus 100. The controller CNT may be inside the imprint apparatus 100, or may be installed in a place different from the location of the imprint apparatus 100 and remotely control the operation of the imprint apparatus 100. The controller CNT can execute the imprint process of forming the pattern of the imprint material R on the substrate W by controlling the imprint apparatus 100. The controller CNT of the present exemplary embodiment forms the pattern by controlling the supply unit 180 to supply the imprint material R, controlling the mold holding unit 130 to bring the mold M into contact with the imprint material R, and controlling the curing unit 120 to cure the imprint material R by the irradiation with the UV light in the contact state. A similar imprint process is executed for the plurality of shot regions on the substrate W.

The imprint apparatus 100 of the present exemplary embodiment is configured to form the pattern in the plurality of shot regions on the substrate W by repeating the imprint process. The imprint apparatus 100 of the present exemplary embodiment consecutively supplies the imprint material R to a plurality of shot regions beforehand. Further, the imprint apparatus 100 repeats the process of bringing the mold M and the imprint material R into contact with each other and curing the imprint material R, for the plurality of shot regions supplied with the imprint material R.

Figure 2:
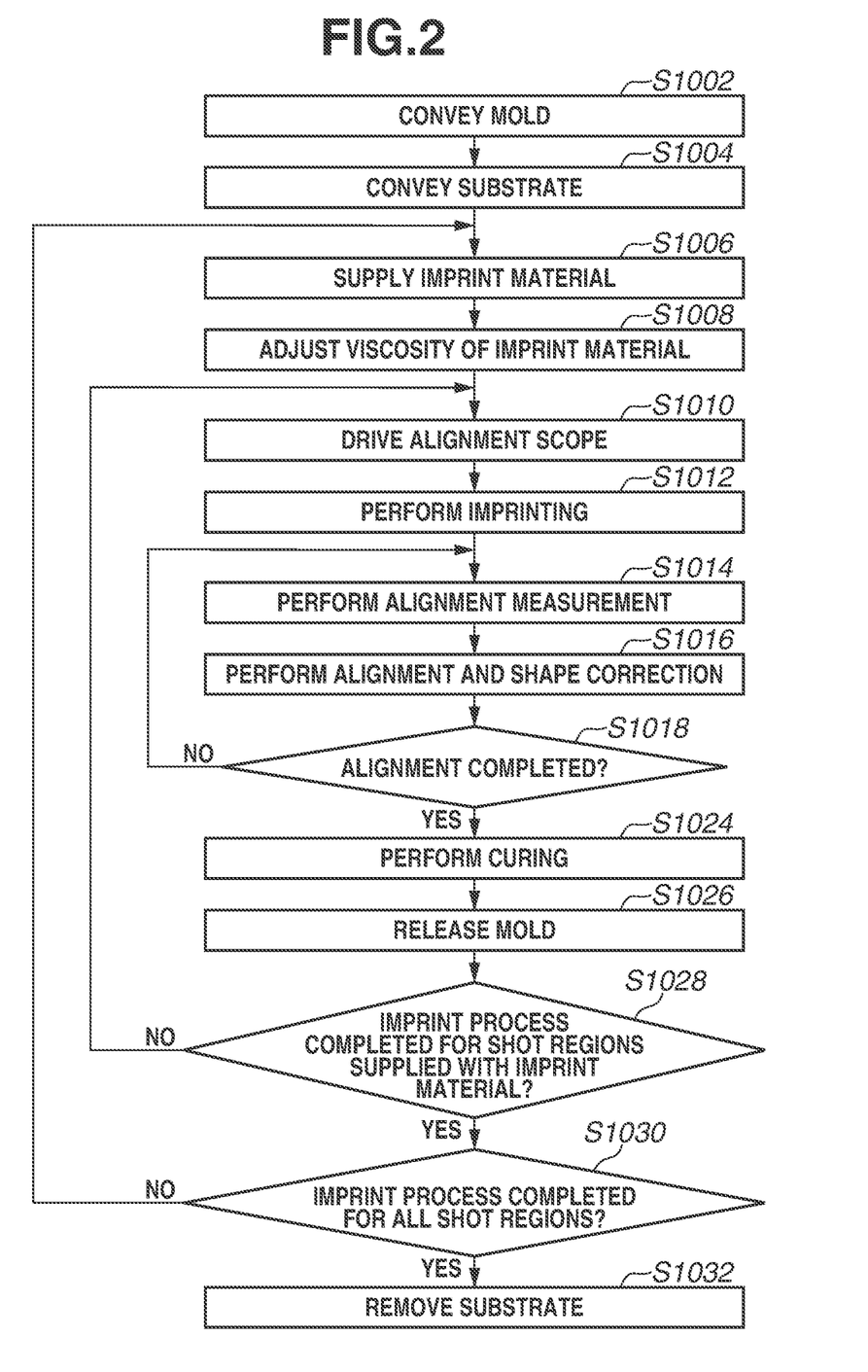
FIG. 2 is a flowchart illustrating an imprint method according to the first exemplary embodiment.

FIG. 2 is a flowchart illustrating an imprint method according to the present exemplary embodiment. The operation of the imprint apparatus 100 will be described below with reference to FIG. 2. The controller CNT controls this operation. Upon start of the imprint operation, in step S1002, the mold conveyance mechanism conveys the mold M to the inside of the imprint apparatus 100 and loads the conveyed mold M on the mold chuck 132, and the mold chuck 132 holds the mold M.

Next, in step S1004, the substrate conveyance mechanism conveys the substrate W to the inside of the imprint apparatus 100 and loads the conveyed substrate W on the substrate chuck 162, and the substrate chuck 162 holds the substrate W. Here, at least one layer of pattern is already formed on the substrate W together with the alignment mark.

Figure 3:
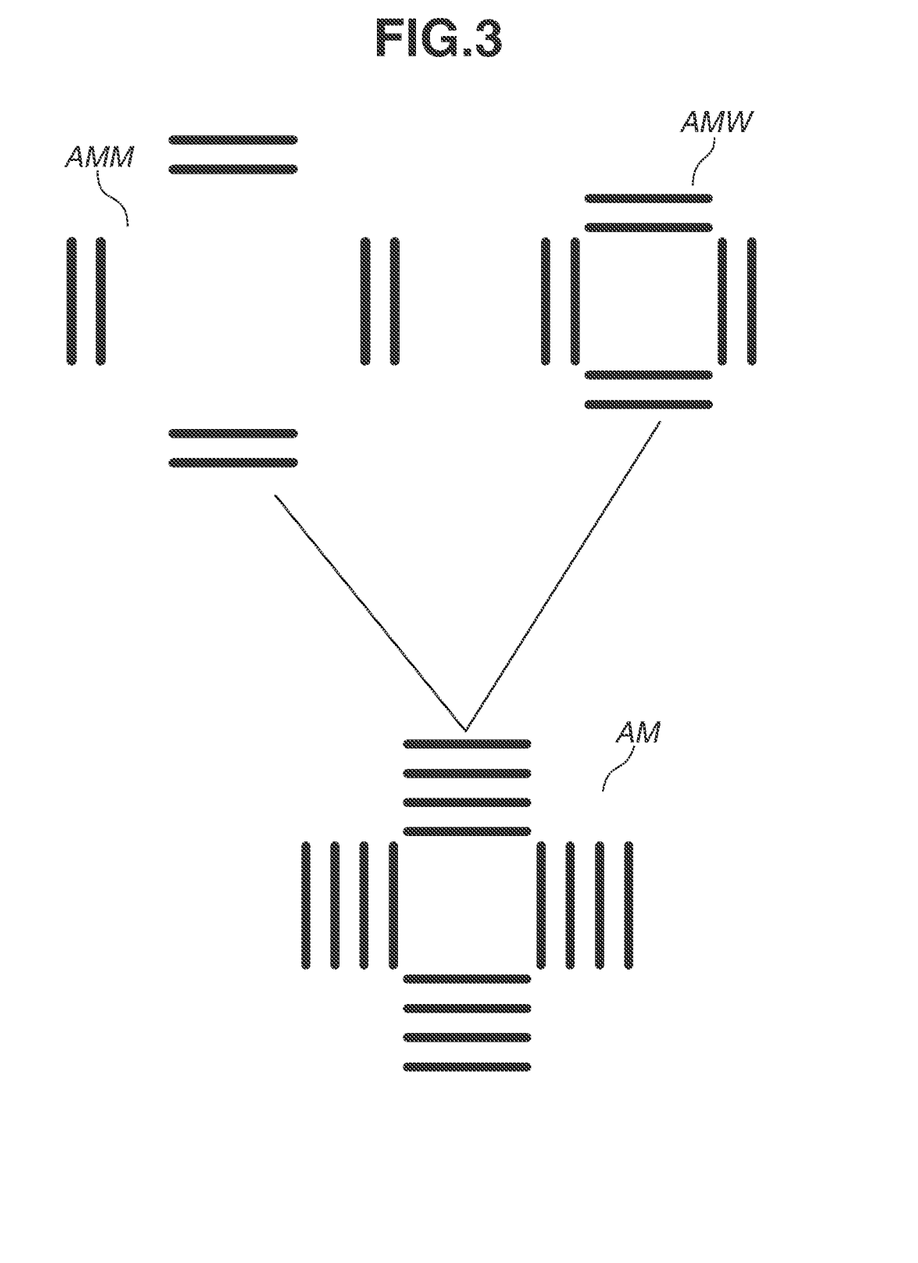
FIG. 3 is a diagram illustrating an example of an alignment mark.
Figure 4:
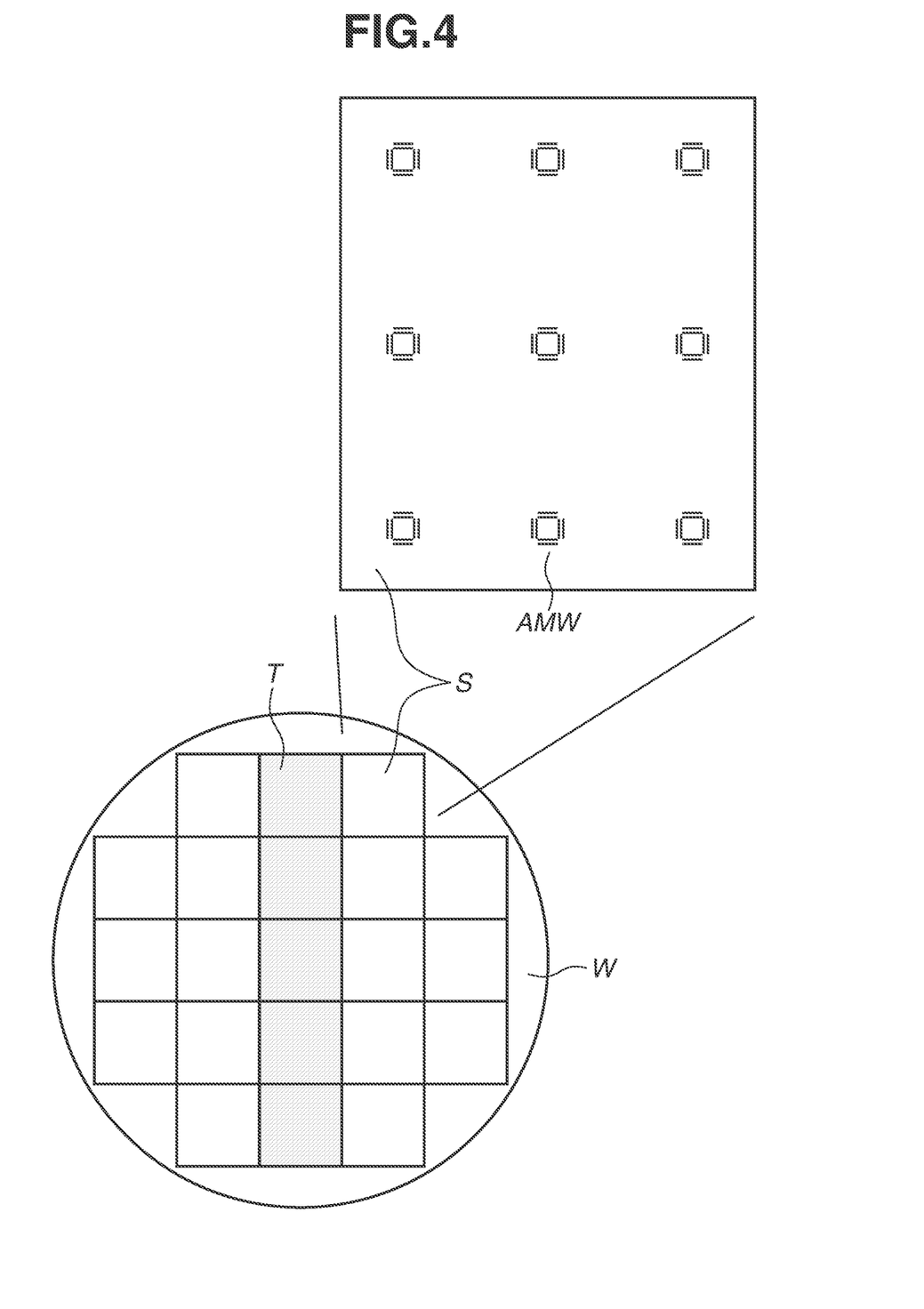
FIG. 4 is a diagram illustrating a shot region on a substrate.

For example, as illustrated in FIG. 3, the alignment mark to be used for alignment is formed on each of the mold M and the substrate W. A mold-side alignment mark AMM formed on the mold M and a substrate-side alignment mark AMW formed on the substrate W are arranged not to overlap each other, and the alignment scope 172 detects the substrate-side alignment mark AMW via the mold M. The alignment scope 172 detects the mold-side alignment mark AMM and the substrate-side alignment mark AMW, so that the relative position between the mold M and the substrate W can be measured. As illustrated in FIG. 4, the substrate W has a plurality of shot regions S, and the plurality of substrate-side alignment marks AMW is formed in each of the shot regions S. The alignment mark is not limited to the mode illustrated in FIG. 3, and a mode of detecting moire fringes generated by using a diffraction grating as the alignment mark may be adopted.

Next, in step S1006, the supply unit 180 supplies the imprint material R to a plurality of shot regions on the substrate W. As described above, in the present exemplary embodiment, the imprint material R is supplied to the plurality of shot regions beforehand. For example, as represented by regions T in FIG. 4, shot regions in a column on the substrate W are selected as the plurality of shot regions so that the imprint material R is supplied while the substrate stage 164 is driven for one scan.

In step S1008, immediately after the imprint material R discharged from the discharge outlet of the supply unit 180 adheres to the substrate W, the viscosity adjustment unit 200 irradiates the imprint material R supplied onto the substrate W with the UV light, thereby adjusting the viscosity of the imprint material R. The time period from the supply of the imprint material R to imprinting is short for the shot region supplied first and is long for the shot region supplied last. Therefore, the time periods in which the imprint material R volatilizes can vary among the plurality of shot regions, so that the volume of the imprint material R can vary from the shot region to the shot region on the substrate W in imprinting. If the volume of the imprint material R varies, the transfer of the pattern formed on the mold M can be unsuccessful. Therefore, the intensify of the UV light for irradiation is weak for the shot region to be imprinted first and is strong for the shot region to be imprinted last among the plurality of shot regions to be supplied with the imprint material R, so that the viscosity of the imprint material gradually changes. The amount of the volatilized imprint material R can be controlled by varying the viscosity of the imprint material R among the shot regions, so that the volume of the imprint material R in imprinting can be uniform for the plurality of shot regions, irrespective of the timing of imprinting. Further, it is not necessary to change the viscosity of the imprint material R to be supplied for all the plurality of shot regions, and it may be sufficient to adjust the viscosity of the imprint material to be supplied for at least some of the shot regions.

In step S1010, the scope driving mechanism 174 drives the alignment scope 172 to the position of the mold-side alignment mark AMM.

In step S1012, the mold holding unit 130 brings the mold M close to the substrate W, so that an imprinting process of bringing the mold M into contact with the imprint material R on the substrate W is performed. Here, the mold M and the imprint material R may be brought into contact with each other by bringing (raising) the substrate W close to the mold M, instead of driving the mold M. Further, the mold M and the imprint material R may be brought into contact with each other by bringing the mold M and the substrate W close to each other. The load of pressing can be controlled by, for example, using a load sensor built in the mold driving mechanism 134.

In step S1014, alignment measurement is performed while the mold M and the imprint material R are in contact with each other. Specifically, from the result of imaging the mold-side alignment mark AMM and the substrate-side alignment mark AMW by the alignment scope 172, an image-processing apparatus (not illustrated) measures the relative position between the alignment mark of the mold M and the alignment mark of the substrate W. Based on the result of measuring the relative position between the alignment marks, the difference in shape (such as shift, rotation, magnification, and trapezoid component) between the pattern region of the mold M and the shot region of the substrate W is measured.

In step S1016, alignment is performed based on the result of the alignment measurement in step S1014. Further, the mold shape correcting unit 140 corrects the shape of the mold M as appropriate, in order to match the shape of the pattern region of the mold M with the shape of the shot region of the substrate W. This alignment process in step S1016 is repeated until the alignment is completed.

In step S1018, whether the alignment is completed is determined. If the alignment is completed (YES in step S1018), the operation proceeds to step S1024 to start curing the imprint material R. In step S1024, the curing unit 120 cures the imprint material R by irradiating the imprint material R with the UV light via the mold M. Upon completion of curing, in step S1026, the mold M is released from the cured imprint material R (the mold release). In the release process, the mold holding unit 130 may raise the mold M, or the substrate holding unit 160 may lower the substrate W, or both of the mold M and the substrate W may be moved. The mold M is released from the cured imprint material R by increasing the distance between the mold M and the substrate W. In this way, the pattern of the imprint material R can be formed in the shot regions of the substrate W.

In step S1028, whether the imprint process is completed for the plurality of shot regions supplied with the imprint material R is determined in step S1006. If the imprint process is not completed for the plurality of shot regions supplied with the imprint material R (NO in step S1028), the operation returns to step S1010, so that the above-described imprint process (step S1010 to step S1026) is repeated for the next shot region.

On the other hand, if the imprint process is completed for the plurality of shot regions supplied with the imprint material R (YES in step S1028), the operation proceeds to step S1030. In step S1030, whether the imprint process is completed for all the shot regions on the substrate W is determined. If the imprint process is not completed for all the shot regions on the substrate W (NO in step S1030), the operation returns to step S1006, so that the imprint process (step S1006 to step S1028) is repeated for a new plurality of shot regions. If the imprint process is completed for all the shot regions (YES in step S1030), the operation proceeds to step S1032. In step S1032, the substrate conveyance mechanism removes the substrate W from the substrate chuck 162.

Therefore, even in a case where the imprint material R is consecutively supplied to the plurality of shot regions, it is possible to form the pattern while reducing the influence of volatilization, by adjusting the viscosity of the imprint material R depending on the time period before the pattern is formed on the imprint material R.

For the imprint apparatus 100 described above, the imprint method of curing the imprint material R by using the photo-curing method is described, but the present exemplary embodiment is not limited to the photo-curing method, and a method of curing an imprint material by using heat may be employed. In the method using heat, for example, a thermoplastic resin is heated to a temperature higher than or equal to the glass-transition temperature, a substrate is pressed against a mold with the resin interposed therebetween in a state where the fluidity of the resin is increased, and the mold is released from the cooled resin, so that a pattern is formed. In the case of an imprint apparatus using heat, a curing unit 120 is a mechanism that cures an imprint material by supplying heat as energy for curing. Therefore, the imprint material is a thermal-curing resin having thermal-curing properties.

The curing unit 120 is the mechanism that cures the imprint material R by applying the energy for curing to the imprint material R via the mold M. Therefore, in a case where the method using heat is employed, the curing unit 120 cures the imprint material R by supplying heat as the energy for curing. Further, in the case where the imprint material R is cured using heat, the viscosity adjustment unit 200 includes a mechanism that supplies heat, and adjusts the viscosity of the imprint material R by applying heat to the imprint material R supplied from the supply unit 180 onto the substrate W. In this case, the viscosity adjustment unit 200 has a function of changing the amount of heat so that the viscosities of the imprint material R vary among the plurality of shot regions.

Second Exemplary Embodiment

Figure 5:
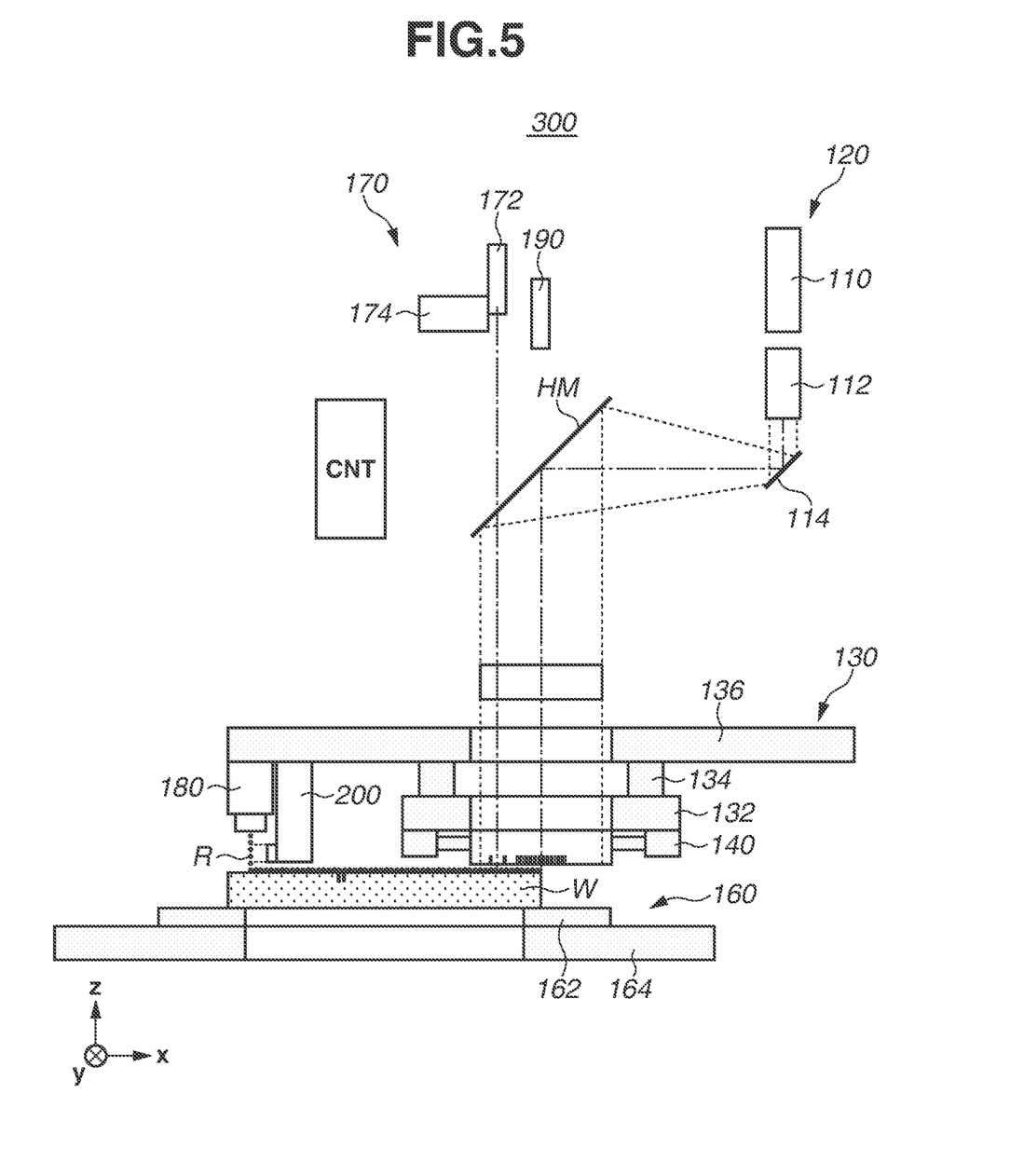
FIG. 5 is a diagram illustrating an imprint apparatus according to a second exemplary embodiment.

FIG. 5 is a schematic diagram illustrating a configuration of an imprint apparatus 300 according to a second exemplary embodiment. The configuration of the imprint apparatus 300 will be described with reference to FIG. 5. In FIG. 5, members similar to those in FIG. 1 are denoted by reference numerals that are the same as those in FIG. 1, and the description thereof will not be repeated. The imprint apparatus 300 brings an imprint material R supplied onto a substrate W into contact with a mold M, and applies energy for curing to the imprint material R, thereby forming a pattern of a curing product to which a concavo-convex pattern of the mold M is transferred. Here, the imprint apparatus 300 to which a photo-curing method of curing an imprint material by irradiation with UV light is applied will be described.

The viscosity adjustment unit 200 of the first exemplary embodiment is described to change the viscosity of the imprint material R on the substrate W. A viscosity adjustment unit 200 of the second exemplary embodiment can change the viscosity before the imprint material R discharged from a discharge outlet of a supply unit 180 adheres to the substrate W, instead of changing the viscosity of the imprint material R on the substrate W. To this end, the viscosity adjustment unit 200 of the second exemplary embodiment points in a direction for enabling the viscosity adjustment unit 200 to irradiate a droplet of the imprint material R with the light in the air. FIG. 5 illustrates an example in which the viscosity adjustment unit 200 is next to the supply unit 180, but the viscosity adjustment unit 200 may be inside the supply unit 180 as an integral portion thereof.

For the imprint apparatus 300 according to the second exemplary embodiment as well, the imprint method of curing the imprint material R by using the photo-curing method is described, but the present exemplary embodiment is not limited to the photo-curing method, and a method of curing an imprint material by using heat may be employed. In this case, the viscosity adjustment unit 200 includes a mechanism that supplies heat, and adjusts the viscosity of the imprint material R by applying heat before the imprint material R discharged from the discharge outlet of the supply unit 180 toward the substrate W adheres to the substrate W. In this case, the viscosity adjustment unit 200 has a function of changing the amount of heat so that the viscosities of the imprint material R vary among a plurality of shot regions.

Therefore, even in a case where the imprint material R is consecutively supplied to the plurality of shot regions, it is possible to form the pattern while reducing the influence of volatilization, by adjusting the viscosity of the imprint material R depending on the time period before the pattern is formed on the imprint material R.

Method of Manufacturing Article

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

Figure 6A:
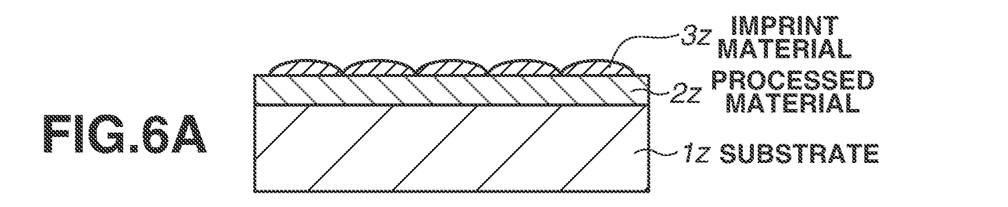
FIGS. 6A to 6F are diagrams illustrating a method of manufacturing an article.

The pattern of the cured product is directly used as the constituent member of at least some of the above-described articles or used temporarily as a resist mask. After etching or ion implantation is performed in the substrate processing step, the resist mask is removed. Furthermore, well-known steps for processing the substrate include etching, resist removal, dicing, bonding, and packaging, and the like A detailed method of manufacturing an article will be described next. As shown in FIG. 6A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 6B:
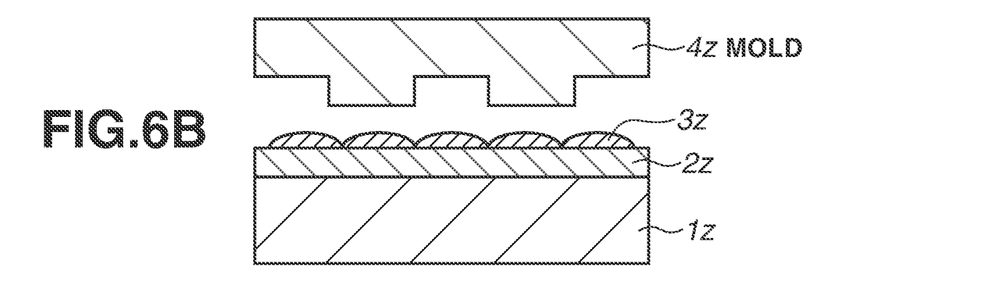
Figure 6C:
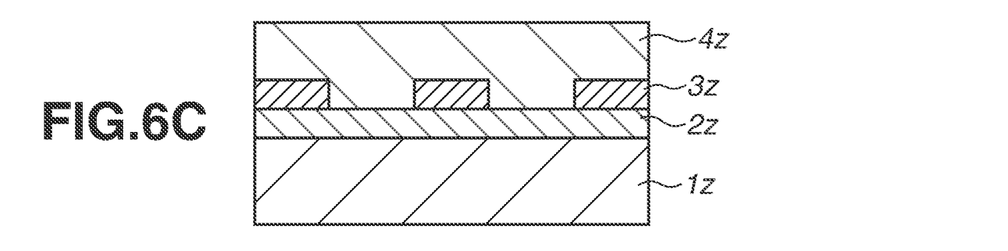

As shown in FIG. 6B, a side of a mold 4z for imprint with an uneven pattern is directed to and caused to face the imprint material 3z on the substrate. As shown in FIG. 6C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing through the mold 4z, the imprint material 3z is cured.

Figure 6D:
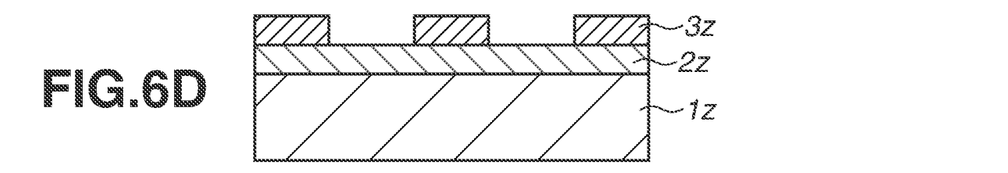

As shown in FIG. 6D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

Figure 6E:
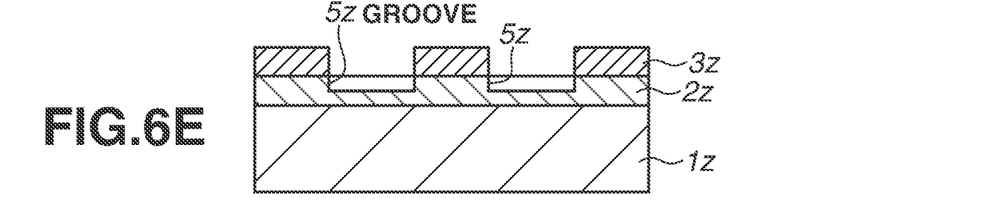
Figure 6F:
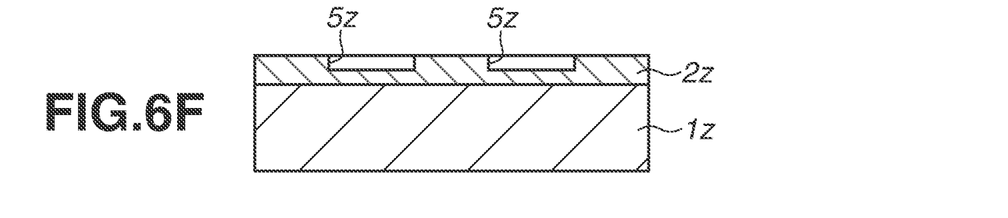

As shown in FIG. 6E, when etching is performed using the pattern of the cured product as an etching resistant mask, a portion of the surface of the processed material 2z where the cured product does not exist or remains thin is removed to form a groove 5z. As shown in FIG. 6F, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article. The method of manufacturing an article according to the embodiment is superior to a conventional method in at least one of the performance, quality, productivity, and production cost of the article.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-207457 filed on Nov. 15, 2019, which is hereby incorporated by reference herein in its entirety.

What is claimed is:

1. An imprint method of forming a pattern of an imprint material on each of a plurality of shot regions in a substrate by using a mold, the imprint method comprising:
   performing a supplying process of supplying an imprint material from a discharger onto the substrate;
   performing an adjusting process of adjusting a viscosity of the imprint material on the substrate by irradiating the imprint material with light;
   performing a contacting process of bringing the imprint material on the substrate into contact with the mold; and
   performing a curing process of curing of the imprint material,
   wherein after the supplying process and the adjusting process for each of the plurality of shot regions are ended, the contacting process and the curing process for the plurality of shot regions are started,
   wherein a volatilization amount of the imprint material on the substrate during a time period from an end of the supplying process until a start of the contacting process is controlled by the viscosity of the imprint material, and
   wherein in the adjusting process, the viscosity of the imprint material is adjusted by changing, in accordance with the time period for each shot region, an intensity of the light with which the imprint material is irradiated.

2. A method of manufacturing an article, the method comprising:
forming a cured product of a material on a substrate by using the imprint method according to claim 1; and
processing the substrate on which the cured product of the material is formed.

3. The imprint method according to claim 1, wherein in the adjusting process, the imprint material is irradiated with the second light in a state where the mold and the imprint material on the substrate are not brought into contact with each other.

4. The imprint method according to claim 1, wherein the plurality of shot regions includes a first shot region for which the imprint process is performed first, and a second shot region for which the imprint process is performed last, and
the intensity of the light in the adjusting process is changed between the plurality of shot regions, in accordance with the time period for each shot region, such that the intensity of the light for the second shot region is stronger than that for the first shot region.

5. The imprint method according to claim 1, wherein the intensity of the light in the adjusting process is changed in accordance with the time period, such that a volume of the imprint material when the contacting process is started is the same between the plurality of shot regions.

* * * * *